United States Patent [19]

Hirasawa et al.

[11] 4,173,734
[45] Nov. 6, 1979

[54] VOLTAGE DIVIDING INTEGRATED CIRCUIT DEVICE

[75] Inventors: Masataka Hirasawa, Ayase; Akira Hashimoto, Yokohama; Kenichi Nagao, Yokohama; Toshiaki Kobayashi, Yokohama, all of Japan

[73] Assignee: Tokyo Shibaura Electric Co., Ltd., Japan

[21] Appl. No.: 873,882

[22] Filed: Jan. 31, 1978

[30] Foreign Application Priority Data

Jan. 31, 1977 [JP] Japan .................................. 52-9396

[51] Int. Cl.² ....................... H01L 27/10; G05F 3/10
[52] U.S. Cl. ..................................... 323/8; 323/94 R; 323/97; 357/42; 357/51
[58] Field of Search ................ 307/304; 323/8, 22 R, 323/94 R, 81, 96, 97; 338/307, 308; 357/51

[56] References Cited

U.S. PATENT DOCUMENTS

| | | | |
|---|---|---|---|
| 3,936,676 | 2/1976 | Fujita | 323/22 R |
| 4,016,483 | 4/1977 | Rudin | 323/94 R |
| 4,092,662 | 5/1978 | Daughton | 357/51 X |

OTHER PUBLICATIONS

Ferry, "The Precision Planar Resistor", New Electronics, vol. 8, No. 9, Apr. 29, 1975, pp. 53, 54, 57, 58, 61.

Primary Examiner—A. D. Pellinen
Attorney, Agent, or Firm—Finnegan, Henderson, Farabow & Garrett

[57] ABSTRACT

In a semiconductor substrate of a first conductivity type fixed at a predetermined potential are formed a plurality of resistive regions of a second conductivity type. The resistive regions are connected in series between first and second potential supply terminals, through equally divided potential taking-out electrodes formed on the substrate. The resistive regions are so formed as to be progressively decreased in length in the order that the potential difference between the resistive region and the substrate increases to cause the resistive regions to have the substantially equal resistance values.

6 Claims, 4 Drawing Figures

VOLTAGE DIVIDING INTEGRATED CIRCUIT DEVICE

BACKGROUND OF THE INVENTION

The present invention relates to a voltage dividing integrated circuit device and, more particularly, a voltage dividing integrated circuit device suitable for providing equally divided potentials necessary for dynamically driving a liquid crystal display device.

An AC driving system is desirable for driving a liquid crystal display device due to its chemical characteristic. That is, in order to prolong the life of a liquid crystal display device, it is necessary to cancel out the influence of a positive applied voltage on the liquid crystal display device by application of a negative voltage and vice versa. The dynamic driving system in which segment electrodes of the display device are scanned on the basis of a time division, generally uses voltage levels of three or more because the liquid crystal device has a relatively long response time. In the drive voltages, the maximum and the minimum voltage levels may be positive and negative potential levels of a power supply source. The intermediate potential levels may be provided by division of the power source voltage. In electronic digital apparatus, it is desirable that the voltage dividing circuit be integrated on a single semiconductor chip, together with a logic circuit section and a liquid crystal drive circuit.

Referring to FIG. 1, there is shown an example of an integrable voltage dividing circuit which is disclosed in the copending application Ser. No. 818,295, filed Sept. 22, 1977, entitled "DISPLAY DEVICE DRIVING VOLTAGE PROVIDING CIRCUIT" and assigned to the same assignee as the present application.

In this example which is directed to a ⅓ duty and ⅓ prebias display system, a voltage dividing circuit 11 connected between power supply terminals 12 and 13 connected across a $-E$ volt power source 14 provides to a driver circuit 15 the minimum potential $-E_0$, the maximum potential 0 volt, and equally divided voltages $-\frac{2}{3}E_0$, $-\frac{1}{2}E_0$, and $-\frac{1}{3}E_0$. The driver circuit 15 is connected to receive control signals $h_1$, $h_2$, and $h_3$ and data signals from a CMOS logic circuitry 17 to provide to an 8-digit liquid crystal display device 16 scanning pulses $H_1$, $H_2$, and $H_3$, segment signals $\alpha_1$ to $\alpha_8$, $\beta_1$ to $\beta_8$ and $\gamma_1$ to $\gamma_8$.

The voltage dividing circuit 11 is comprised of four voltage dividing units $U_1$ to $U_4$ connected in series between the power supply terminals 12 and 13. The voltage dividing unit $U_1$ includes resistive elements $R_{11}$ and $R_{21}$ and a P channel MOS transistor $P_1$; the dividing unit $U_2$ resistive elements $R_{12}$ and $R_{22}$ and a P channel MOS transistor $P_2$; the dividing unit $U_3$ resistive elements $R_{13}$ and $R_{23}$ and an N channel MOS transistor $N_1$; the dividing unit $U_4$ resistive elements $R_{14}$ and $R_{24}$ and an N channel MOS transistor $N_2$. A clock pulse $\phi$ is applied to the gates of the P channel MOS transistors $P_1$ and $P_2$; a clock $\overline{\phi}$ to the gates of the N channel MOS transistors $N_1$ and $N_2$. For obtaining the equally divided potentials, the resistors $R_{11}$ to $R_{14}$ have equal resistance values and similarly resistors $R_{21}$ to $R_{24}$ have equal resistance values. The resistance value of the resistors $R_{11}$ to $R_{14}$ may be ranged from 100 to 400KΩ and the resistance value of the resistors $R_{21}$ to $R_{24}$ may be approximately 10kΩ.

The voltage dividing circuit 11 is formed on a single semiconductor chip, together with the CMOS logic circuit 17 and the driver circuit 15. In the integrated circuit, a resistor is made of a semiconductor region of a conductivity type opposite to that of a semiconductor region in which the resistor is formed. In order that a plurality of resistive regions have the same resistance values, these regions are generally formed to have the same dimensions. For a high density integrated circuit it is desirable to make the occupied areas of the high resistance elements $R_{11}$ to $R_{14}$ as small as possible. This necessitates, however, increase of sheet resistance of the resistive region. For this reason, the resistive region is formed by a semiconductor region having a low concentration of impurities. In this case, the voltage-current characteristic of the resistor region with a low concentration of impurities depends largely on a potential difference between the resistor region and the substrate, compared to a resistive region with a high concentration of impurities. In general, the resistive region with a low concentration of impurities has a saturation characteristic in which, current flowing through the resistor region does not change linearly with change of an applied voltage but saturates. The degree of the current saturation becomes larger as the potential difference between the resistive region and the substrate is larger. Therefore, with respect to the resistors $R_{11}$ to $R_{14}$ shown in FIG. 1, the potential difference becomes larger in the order of $R_{11}$, $R_{12}$, $R_{13}$ and $R_{14}$. As a result, where the resistive regions $R_{11}$ to $R_{14}$ have the same dimensions, even if the same voltage is applied across each resistive region, the resistive regions $R_{11}$ to $R_{14}$ would have different resistance values. This implies that it fails to obtain desired equally divided potentials for driving liquid crystal and the life of the liquid crystal is shortened.

SUMMARY OF THE INVENTION

Accordingly, an object of the present invention is to provide a voltage dividing integrated circuit device for providing equally divided potentials.

Another object of the present invention is to provide a voltage dividing integrated circuit device which produces equally divided potentials for driving a liquid crystal display device.

Still another object of the present invention is to provide a voltage dividing integrated circuit device which can be preferably integrated on a semiconductor chip together with a CMOS logic circuitry.

According to the present invention, there is provided a voltage dividing integrated circuit device for providing equally divided potentials between first and second potentials comprising: a semiconductor substrate of a first conductivity type coupled with a predetermined potential; and a plurality of resistive regions of a second conductivity type formed in the semiconductor substrate which are connected in series between first and second potential supplying terminals, through at least one equally divided potential taking-out electrode, the lengths of the resistive regions being made progressively shorter in the increasing order of the potential difference between each of the resistive regions and the substrate thereby to ensure substantially equal resistive values of the resistive regions.

These and other objects of the invention will be seen by reference to the description, taken in connection with the accompanying drawings, in which:

DETAILED DESCRIPTION OF THE PREFERRED EMBODIMENT

Figure 1:
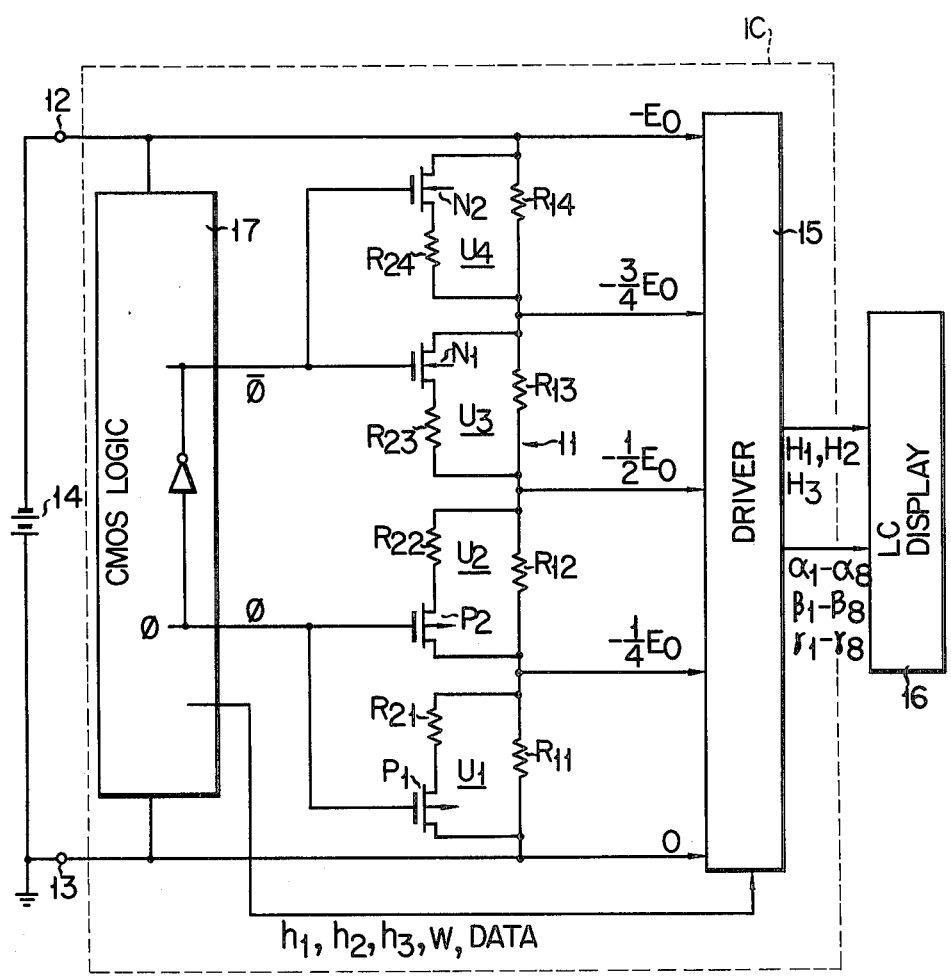
FIG. 1 shows an example of a circuit diagram of a driving voltage source for a liquid crystal display device.
Figure 2:
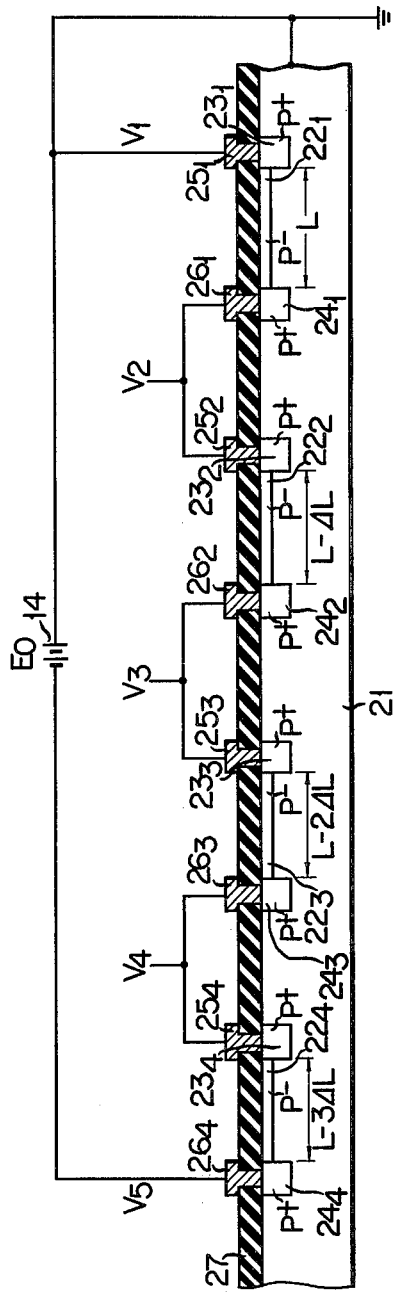
FIG. 2 schematically shows in cross section a voltage dividing integrated circuit device according to the present invention.

As shown in FIG. 2 illustrating an embodiment of a voltage dividing integrated circuit device according to the present invention, P$^-$ type resistive regions $22_1$, $22_2$, $22_3$ and $22_4$ corresponding to the resistors $R_{11}$, $R_{12}$, $R_{13}$ and $R_{14}$ in FIG. 1 are formed in an N type silicon substrate 21 by using an ion implantation technology. Additionally, P+ type regions $23_1$ and $23_1$ are formed adjacent to the ends of the region $22_1$; P+ type regions $23_2$ and $24_2$ adjacent to the ends of the region $22_2$; P+ type regions $23_3$ and $24_3$ adjacent to the ends of the region $22_3$; P+ type regions $23_4$ and $24_4$ adjacent to the ends of the region $22_4$. The P+ type regions are connected to corresponding aluminum electrodes $25_1$ to $25_4$ and $26_1$ to $26_4$, through through-holes formed in an oxide layer 27 formed on the silicon substrate 21, respectively. The P+ type regions are provided to establish ohmic contact of the resistive semiconductor regions with the corresponding aluminum electrodes.

The electrodes $26_1$ and $25_2$ are connected together to take out a divided potential $V_2$. Connection between the electrodes $26_2$ and $25_3$ takes out a divided potential $V_3$. Connection of the electrode $26_3$ with the electrode $25_4$ is made to take out a divided potential $V_4$. The electrode $26_4$ connected at one end of the resistive region $22_4$ corresponding to the resistor $R_{14}$ is connected to the negative terminal of a power source 14. The electrode $25_1$ connected to one end of the resistive region 22, corresponding to the resistor $R_{11}$ is connected to the positive terminal of the power source 14, i.e. the circuit ground. The silicon substrate 21 is connected to circuit ground.

Figure 3:
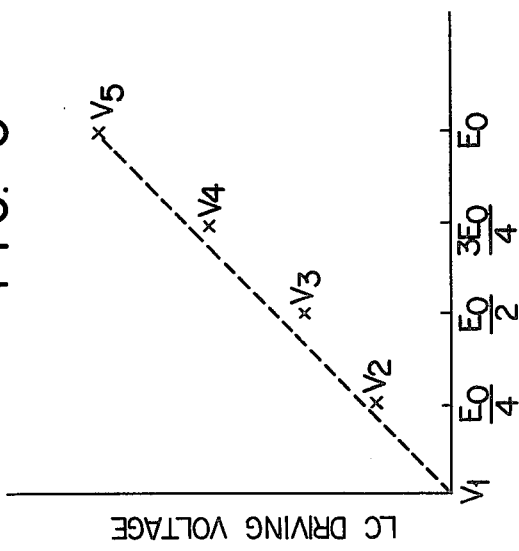
FIG. 3 shows deviations of actual driving voltages from ideal driving voltages.

When the resistive regions $22_1$ to $22_4$ are formed with the same dimensions in length, width and depth, and with the same concentration of impurities, the divided potentials $V_2$, $V_3$ and $V_4$ do not coincide with ideal divided potentials $-\frac{1}{4}E_0$, $-\frac{1}{2}E_0$ and $-\frac{3}{4}E_0$, as shown in FIG. 3. In the present invention, the resistive regions are formed identically in depth, width and impurity concentration but differently in length in accordance with the saturation characteristic. That is, the length is made shorter for the resistive region whose potential difference against the silicon substrate is larger.

In a preferred embodiment of the invention, the lengths of the respective regions $22_1$, $22_2$, $22_3$ and $22_4$ are selected L, L−ΔL, L−2ΔL, and L−3ΔL, respectively, as shown in FIG. 2. Generally, when the number of the resistive regions formed are N (2, 3, 4 . . . ), the length of the resistive regions are L, L−ΔL, L−2ΔL, . . . L−(N−1)ΔL.

The ratio of the compensation value ΔL to the length L, ΔL/L may be 0.015 to 0.03 when the operating voltage $E_0$ is 2.5 to 4 V and 0.02 to 0.04 when the power supply voltage $E_0$ is 4 to 5 V, under a condition that the impurity concentration of the N type silicon substrate is about $10^{15}$cm$^{-3}$, the impurity concentration in the P$^-$ type resistive region is approximately $10^{17}$cm$^{-3}$, and the depth of the resistive region is about 1 micron. In order that the resistive region has approximately 130kΩ under this condition, the length L is selected about 360 microns and the width about 14 microns. When the resistive regions $22_1$ to $22_4$ have each about 130kΩ, their lengths are about 360 microns, 354 microns, 348 microns and 342 microns, for example, respectively.

The P$^-$ type resistive regions $22_1$ to $22_4$ are preferably integrated on a single semiconductor chip together with the CMOS logic circuitry 17, driver circuit 15, and the resistors $R_{21}$ to $R_{24}$ and MOS transistors $P_1$, $P_2$, $N_1$, $N_2$ shown in FIG. 1. In general, with a CMOS transistor integrated circuit, in P well regions in an N type substrate used to form N channel transistors therein and having an impurity concentration of about $10^{16}$cm$^{-3}$, P type stopper regions which are shallower and have an impurity concentration slightly higher than the P wells are formed adjacent to the surface of the P well regions respectively for separation between P and N channel transistors. Accordingly, the above mentioned P$^-$ type regions $22_1$ to $22_4$ can be formed at the same time that the stopper regions are formed by ion implantation process without the necessity of an additional manufacturing process for the resistive regions.

Figure 4:
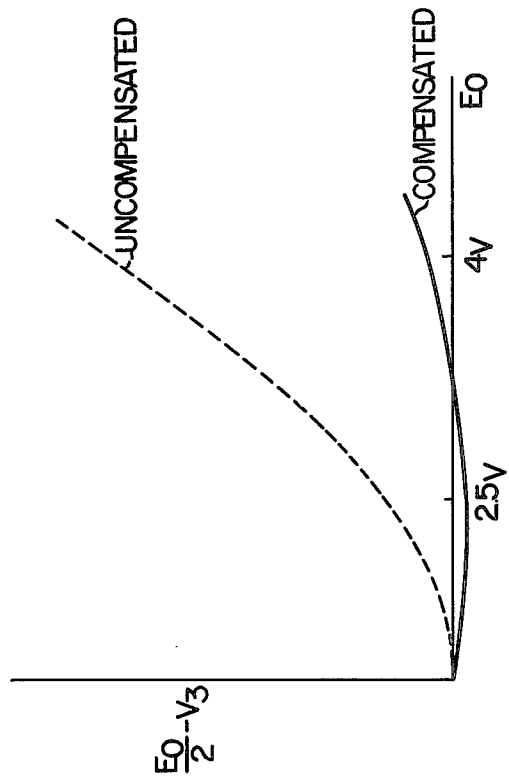
FIG. 4 is a graph for explaining the error of an output voltage of the voltage dividing circuit in which resistive regions are compensated in length in accordance with the present invention and the error of the corresponding output voltage of an uncompensated voltage dividing circuit with respect to variation in the power supply voltage.

Referring now to FIG. 4, there is shown relationships of an error, ($E_0/2 - V_3$) between an actual drive voltage $V_3$ and the corresponding ideal voltage $E_0/2$. The drive voltage $V_3$ has the largest deviation from the corresponding ideal drive voltage. In the graph, a dashed curve is used to designate the relationship when the resistive regions are not compensated in length. A solid curve designates the relation when the resistive regions are compensated in length. As seen from the graph, with the uncompensated dividing circuit the deviation decreases as the voltage of the battery power source decreases, keeping its polarity unchanged. In the voltage dividing circuit in which the resistive regions are compensated, the deviation $E_0/2 - V_3$ is remarkably reduced, compared to the uncompensated dividing circuit, with accompaniment of polarity change. When the polarity change portion of the voltage deviation is involved within the usable voltage range of battery, the polarity change of the voltage deviation is very advantageous in prolongation of the life of the liquid crystal.

The embodiment of the present invention has been described with reference to a liquid crystal driving voltage source with five levels. However, the present invention is applicable for four or three levels liquid crystal drive power source. In the four levels drive power source, P channel and N channel MOS transistors which are alternately turned on and off at an interval of the LC display period may be provided in parallel with the resistors $R_{11}$ and $R_{14}$ in the FIG. 1 circuit, respectively. In order to reduce current flowing into the voltage dividing circuit, switching MOS transistors may be connected in series with the resistive regions $R_{11}$ to $R_{14}$, respectively.

What we claim is:

1. A voltage dividing integrated circuit device for providing equally divided potentials between first and second potential supplying terminals comprising:
   a semiconductor substrate of a first conductivity type coupled with a predetermined potential;
   a plurality of resistive regions of a second conductivity type formed in said semiconductor substrate which are connected in series between said first and second potential supplying terminals, and at least one equally divided potential taking-out electrode connected between respective resistive regions, wherein the lengths of said resistive regions are made progressively shorter in the increasing order of the potential difference between each respective resistive region and said substrate thereby to ensure substantially equal resistive values of said resistive regions.

2. A voltage dividing integrated circuit device according to claim 1, in which, when the number of said resistive regions is N (2, 3, 4 . . . ), the lengths of the N resistive regions are L, $L-\Delta L$, $L-2\Delta L$, . . . $L-(N-1)\Delta L$, where $\Delta L$ is a constant depending on the length L.

3. A voltage dividing integrated circuit device according to claim 2, in which the ratio of $\Delta L$ to L ranges from 0.015 to 0.03.

4. A voltage dividing integrated circuit device according to claim 2, in which the ratio of $\Delta L$ to L ranges from 0.02 to 0.04.

5. A voltage dividing integrated circuit device according to claim 1, in which said resistive regions are ion implanted regions.

6. A voltage dividing integrated circuit device according to claim 1 wherein the polarity of an error voltage between the taken-out equally divided potential and an ideal potential is changed with change in the voltage between said first and second potential supply terminals.

* * * * *